(12) United States Patent
Moslehi Bajestan et al.

(10) Patent No.: US 10,381,981 B2
(45) Date of Patent: Aug. 13, 2019

(54) DEGENERATION FOR A WIDEBAND VOLTAGE-CONTROLLED OSCILLATOR

(71) Applicant: Qualcomm Incorporated, San Diego, CA (US)

(72) Inventors: Masoud Moslehi Bajestan, San Diego, CA (US); Mehran Mohammadi Izad, San Diego, CA (US); Mohammad Farazian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/706,034

(22) Filed: Sep. 15, 2017

(65) Prior Publication Data

US 2019/0089302 A1    Mar. 21, 2019

(51) Int. Cl.
*H03L 7/06* (2006.01)
*H03B 5/12* (2006.01)
*H03L 7/093* (2006.01)

(52) U.S. Cl.
CPC ......... *H03B 5/1212* (2013.01); *H03L 7/093* (2013.01); *H03B 2200/009* (2013.01)

(58) Field of Classification Search
CPC .................................................. H03B 5/1212
USPC ....................................................... 327/156
See application file for complete search history.

(56) References Cited

U.S. PATENT DOCUMENTS

| | | | |
|---|---|---|---|
| 8,531,250 B1 | 9/2013 | Luschas | |
| 8,571,511 B2 | 10/2013 | Goldfarb | |
| 8,742,859 B2 | 6/2014 | Jin et al. | |
| 8,842,410 B2* | 9/2014 | Chan | H01F 21/12 307/37 |
| 8,860,521 B2 | 10/2014 | Ahmed et al. | |
| 9,130,505 B2 | 9/2015 | Zuo et al. | |
| 9,184,498 B2 | 11/2015 | Schiller | |
| 9,236,872 B2* | 1/2016 | Tsuhara | H03L 7/099 |
| 9,934,898 B2 | 4/2018 | Mattsson | |
| 2007/0158782 A1 | 7/2007 | Heikkinen | |
| 2013/0135057 A1* | 5/2013 | Roithmeier | H03B 5/1284 331/117 FE |
| 2015/0263670 A1 | 9/2015 | Fan et al. | |
| 2015/0263671 A1 | 9/2015 | Nguyen et al. | |
| 2016/0065131 A1* | 3/2016 | Pavao-Moreira | H03B 5/1215 331/108 C |

(Continued)

*Primary Examiner* — Metasebia T Retebo
(74) *Attorney, Agent, or Firm* — Colby Nipper/Qualcomm (57) ABSTRACT

The present disclosure describes aspects of degeneration for a wideband voltage-controlled oscillator (VCO) circuit. In some aspects, the VCO circuit includes a degeneration network that includes a first inductor, a second inductor, and a capacitor. The degeneration network is connected between the a supply voltage and ground, with the capacitor connected across the differential VCO, between the sources of cross-coupled PMOS transistors and the sources of cross-coupled NMOS transistors. Control circuitry selects an inductance value of a switched inductance network to select a frequency band in which the VCO circuit operates. The control circuitry also sets a switched capacitor bank and a variable capacitor bank to tune the VCO circuit to an operating frequency within the selected frequency band. The control circuitry further tunes the degeneration network to degenerate the VCO circuit to reduce phase noise in an output signal of the VCO circuit.

30 Claims, 4 Drawing Sheets

(56) References Cited

U.S. PATENT DOCUMENTS

2016/0254084 A1 9/2016 Nilsson et al.
2019/0089304 A1 3/2019 Moslehi et al.

* cited by examiner

DEGENERATION FOR A WIDEBAND VOLTAGE-CONTROLLED OSCILLATOR

FIELD OF THE DISCLOSURE

This disclosure relates generally to radio frequency (RF) circuitry, and more specifically to degeneration for the reduction of phase noise in wideband oscillator circuits in an integrated circuit (IC).

BACKGROUND

This description of related art is provided for the purpose of generally presenting a context for the disclosure that follows. Unless indicated otherwise herein, concepts described in this section are not prior art to this disclosure and are not admitted to be prior art by inclusion herein.

Many computing and electronic devices include a transceiver to facilitate communication over a wireless network or directly with other devices. To increase the available capacity of wireless bandwidth, additional bands of spectrum have been allocated for wireless access networks. To use these additional bands, transceivers are designed to have oscillator circuits that cover an increasingly wider frequency range in an RF circuit, such as a voltage-controlled oscillator (VCO).

Covering the wide frequency range of cellular radio bands can involve using multiple voltage-controlled oscillators (VCOs), which consume a large amount of power and die area of an integrated circuit. Solutions to widen the turning range of a single VCO can lead to a degradation of phase noise or an increase in power consumption by the VCO, as well as occupying an even larger area on an integrated circuit.

Degeneration is one technique that is used to reduce phase noise, especially flicker or 1/f noise, in VCOs. Degeneration circuits or networks are circuit elements that are configured as a tuned circuit or circuits that reduce the generation of phase noise in a VCO. The degeneration network is tuned to the second harmonic of the VCO frequency to improve phase noise. In implementing wideband VCOs, the quality factor (Q) of degeneration networks may be reduced, lowering the effectiveness of the degeneration network to reduce phase noise in the output of the VCO.

SUMMARY

In some aspects of degeneration for a wideband voltage-controlled oscillator, a voltage-controlled oscillator (VCO) circuit includes a tank circuit coupled to a pair of nodes that include a first node and a second node. The VCO circuit also includes a first cross-coupled transistor pair of a first transistor type, with a drain terminal of a first transistor of the first cross-coupled transistor pair connected to the first node of the pair of nodes, a drain terminal of a second transistor of the first cross-coupled transistor pair connected to the second node of the pair of nodes, and a source terminal of the first transistor of the first cross-coupled transistor pair and a source terminal of the second transistor of the first cross-coupled transistor pair connected to a third node. The VCO circuit additionally includes a second cross-coupled transistor pair of a second transistor type, with a drain terminal of a third transistor of the second cross-coupled transistor pair connected to the first node of the pair of nodes, a drain terminal of a fourth transistor of the second cross-coupled transistor pair connected to the second node of the pair of nodes, and a source terminal of the third transistor of the second cross-coupled transistor pair and a source terminal of the fourth transistor of the second cross-coupled transistor pair connected to a fourth node. The VCO circuit further includes a degeneration network that includes a first inductor connected between the third node and a supply voltage, a second inductor connected between the fourth node and a ground, and a capacitor, with a first terminal of the capacitor connected to the third node and a second terminal of the capacitor connected to the fourth node.

In other aspects of degeneration for a wideband voltage-controlled oscillator, a VCO includes a tank circuit coupled to a pair of nodes, with the pair of nodes including a first node and a second node. The VCO also includes a first cross-coupled transistor pair of a first transistor type, with a drain terminal of a first transistor of the first cross-coupled transistor pair connected to the first node of the pair of nodes, a drain terminal of a second transistor of the first cross-coupled transistor pair connected to the second node of the pair of nodes, and a source terminal of the first transistor of the first cross-coupled transistor pair and a source terminal of the second transistor of the first cross-coupled transistor pair connected to a third node. The VCO additionally includes a second cross-coupled transistor pair of a second transistor type, with a drain terminal of a third transistor of the second cross-coupled transistor pair connected to the first node of the pair of nodes, a drain terminal of a fourth transistor of the second cross-coupled transistor pair connected to the second node of the pair of nodes, and a source terminal of the third transistor of the second cross-coupled transistor pair and a source terminal of the fourth transistor of the second cross-coupled transistor pair connected to a fourth node. The VCO further includes means for providing a differential degeneration voltage to the VCO.

In yet other aspects of degeneration for a wideband voltage-controlled oscillator, a voltage-controlled oscillator (VCO) operating method includes generating an oscillating signal having a fundamental frequency using a voltage controlled oscillator that comprises a tank circuit, a first cross-coupled transistor pair of a first transistor type, drain terminals of the first cross-coupled transistor pair being connected to the tank circuit, and source terminals of the first cross-coupled transistor pair being connected to a first node, and a second cross-coupled transistor pair of a second transistor type, drain terminals of the second cross-coupled transistor pair being connected to the tank circuit, and source terminals of the second cross-coupled transistor pair being connected to a second node. The method also includes presenting a frequency-dependent impedance to the source terminals of the cross-coupled transistor pairs using a resonant circuit that comprises a first inductor connected between the first node and a supply voltage, a second inductor connected between the second node and a ground, and a capacitor connected between the first node and the second node, the resonant circuit being tuned to resonate at a frequency that is twice the fundamental frequency.

In further aspects of degeneration for a wideband voltage-controlled oscillator, a frequency synthesizer apparatus includes a phase locked loop (PLL) synthesizer that includes a reference oscillator configured to generate a reference frequency signal. The PLL synthesizer also includes a VCO configured to generate an output signal having a frequency that is controlled at least partially by the reference frequency signal. The VCO includes a degeneration network that is configured to degenerate phase noise in the output signal of the VCO in response to a degeneration-tuning control signal, with the degeneration network including a degeneration capacitor bank that is configured to tune the degeneration network in relation to the frequency of the VCO.

The foregoing summary is provided to briefly introduce some of the aspects described herein. This summary is not intended to identify key or essential features of these or other aspects that are further described throughout the disclosure.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Degeneration techniques are used in voltage-controlled oscillators (VCOs) to reduce phase noise throughout the tuning range of the VCO. Wideband VCOs with broad tuning ranges therefore utilize tunable degeneration networks that are capable of providing phase noise reduction over the entire tuning range of the VCO. Conventionally-implemented degeneration techniques, such as single-ended degeneration circuits, employ two tunable resonant circuits to degenerate phase noise generated by the VCO. A first tunable resonant circuit is connected between the sources of P-channel transistors and the power supply for the VCO. A second tunable resonant circuit is connected between the sources of N-channel transistors and the ground connection of the VCO.

However, scaling single-ended degeneration circuits to match the frequency range of wideband VCOs requires additional area on the integrated circuit and results in a reduced quality factor (Q) of the degeneration circuit. The reduced Q lowers the effectiveness of the single-ended degeneration circuits in reducing phase noise generated by the VCO.

Each of these two tunable resonant circuits is an LC tank with an inductor and a tunable capacitor, such as a switched capacitor bank. The tunable resonant circuits are tuned in tandem to degenerate phase noise in the VCO, typically based on the frequency to which the VCO is tuned.

However, there are design tradeoffs using conventionally-implemented degeneration techniques with single-ended degeneration circuits. Each tunable resonant circuit requires a switched capacitor bank with associated power supply, ground, and control signal routings in an integrated circuit. The tunable resonant circuits of the single-ended degeneration circuits also have a limited quality factor (Q), which reduces the effectiveness of the phase noise reduction provided by the single-ended degeneration circuits as the tuning range of the VCO is increased.

In contrast, this disclosure describes aspects of degeneration for a wideband voltage-controlled oscillator. In example implementations, apparatuses and techniques described herein can implement a degeneration network that includes a first inductor; a switched, degeneration capacitor bank; and a second inductor. The VCO includes a power supply, P-channel transistors, N-channel transistors, and a ground connection. The first inductor is connected between sources of the P-channel transistors and the power supply for the VCO. The second inductor is connected between sources of the N-channel transistors and the ground connection of the VCO. The degeneration capacitor bank is connected between the sources of the P-channel transistors and the sources of N-channel transistors.

In an example operation, the degeneration capacitor bank is set to provide a capacitance that tunes the degeneration network to optimize, or at least enhance, performance of the VCO. For each frequency to which the VCO is tuned, the capacitance of the degeneration capacitor bank is set to reduce (e.g., in an attempt to minimize) phase noise generated by the VCO. For example, in a differential VCO using metal oxide semiconductor (MOS) transistors, which are switching at twice the tuning frequency of the VCO, the capacitance of the degeneration capacitor bank is set to a value that minimizes, or at least reduces, the flicker noise component of the phase noise generated by the switching of the transistors in the VCO.

In aspects of degeneration for a wideband voltage-controlled oscillator, a degeneration network provides a more compact layout for the VCO in an integrated circuit by replacing two tunable capacitors in the single-ended degeneration circuits with a single degeneration capacitor bank. In aspects of degeneration for a wideband voltage-controlled oscillator, the degeneration network also provides a higher Q than conventional degeneration techniques. The higher Q provides a wider tuning range for the degeneration circuit, which improves phase noise reduction in VCOs with wider tuning ranges.

These and other aspects of degeneration for a wideband voltage-controlled oscillator are described below in the context of an example environment, example techniques, and example circuits, such as VCOs and frequency synthesizers. Any reference made with respect to the example environment or circuit, or elements thereof, is by way of example only and is not intended to limit any of the aspects described herein.

Example Environment

Figure 1:
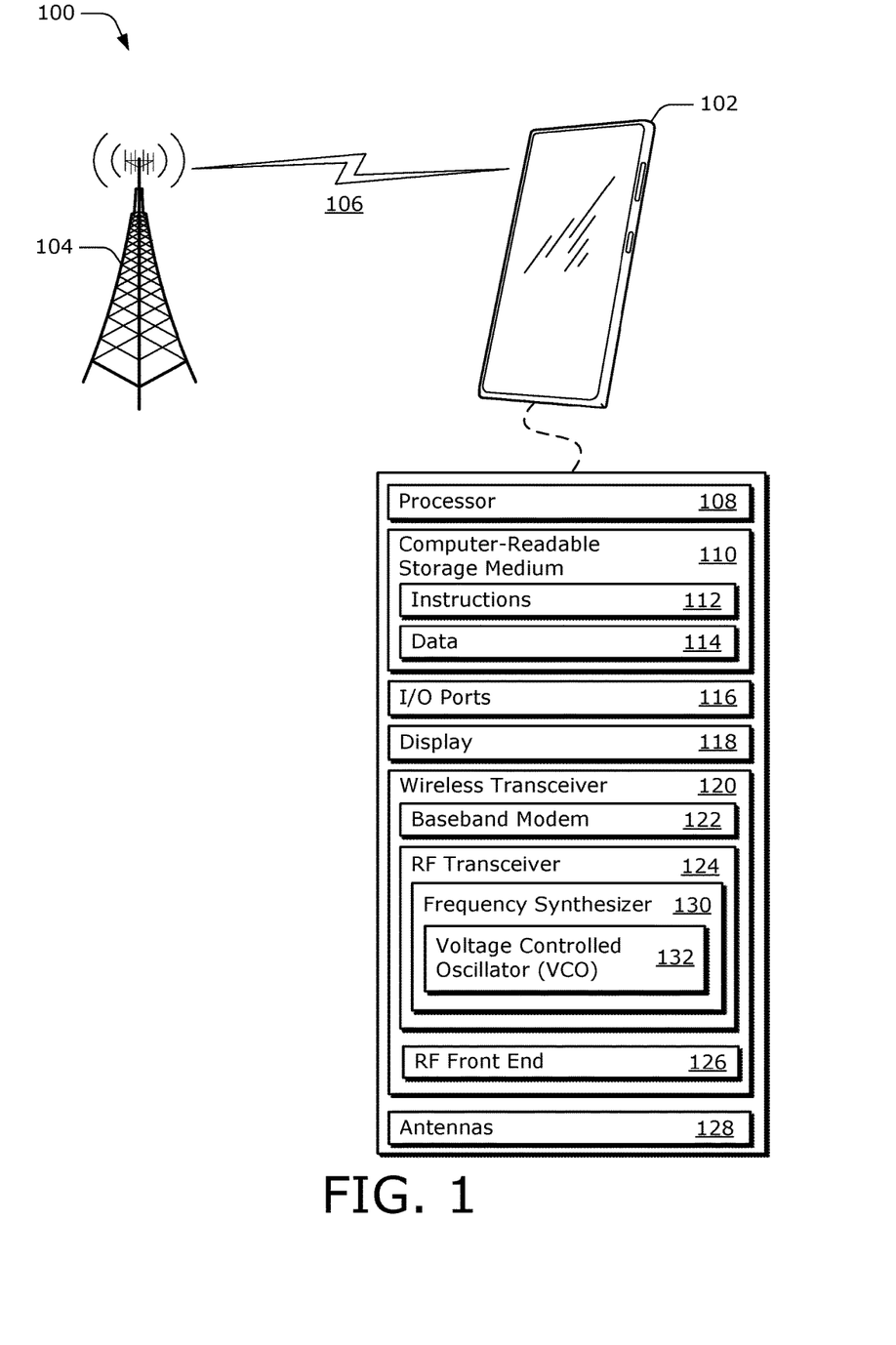
FIG. 1 illustrates an example environment that includes a computing device that is capable of wireless communication and includes a frequency synthesizer.

FIG. 1 illustrates an example environment 100, which includes a computing device 102 that communicates with a base station 104 through a wireless communication link 106 (wireless link 106). In this example, the computing device 102 is implemented as a smart phone. Although illustrated as a smart phone, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and the like.

The base station 104 communicates with the computing device 102 via the wireless link 106, which may be implemented as any suitable type of wireless link. Although shown as a base station, the base station 104 may represent or be implemented as another device, such as a satellite, cable television head-end, terrestrial television broadcast tower, access point, peer-to-peer device, mesh network node, fiber optic line, and the like. Therefore, the computing device 102 may communicate with the base station 104 or another device, via a wired connection, wireless connection, or a combination thereof.

The wireless link 106 can include a downlink of data and control information communicated from the base station 104 to the computing device 102, an uplink of other data and control information communicated from the computing device 102 to the base station 104, or both the downlink and the uplink. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and computer-readable storage medium 110 (CRM 110). The processor 108 may include any type of processor, such as an application processor or multi-core processor, configured to execute processor-executable code stored by the computer-readable storage medium 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment, the wireless transceiver 120 enables the computing device 102 to communicate with the base station 104 and networks connected therewith.

The wireless transceiver 120 includes a baseband modem 122, a radio frequency (RF) transceiver 124, and an RF front end 126 to process data and/or signals associated with communicating data of the computing device 102 over antennas 128. The baseband modem 122 may be implemented as a system-on-chip (SoC) that provides a digital communication interface for data, voice, messaging, and other applications of the computing device 102. The baseband modem 122 may also include baseband circuitry to perform high-rate sampling processes that can include analog-to-digital conversion, digital-to-analog conversion, gain correction, skew correction, frequency translation, and so forth.

The RF transceiver 124 includes circuitry and logic for frequency synthesis, such as a frequency synthesizer 130 that includes a voltage-controlled oscillator 132 (VCO 132). In some cases, components of the RF transceiver 124 are implemented as separate receiver and transceiver entities. The RF transceiver 124 may include logic to perform in-phase/quadrature (I/Q) operations, such as synthesis, encoding, modulation, decoding, demodulation, and the like. In some cases, the RF transceiver 124 is implemented with multiple or different sections to implement respective receiving and transmitting operations (e.g., at least partially separate transmit and receive chains).

The RF front end 126 may include filters, switches, and amplifiers for conditioning signals received via the antennas 128 or signals to be transmitted via the antennas 128. The implementation and use of these entities vary and is described further herein.

Figure 2:
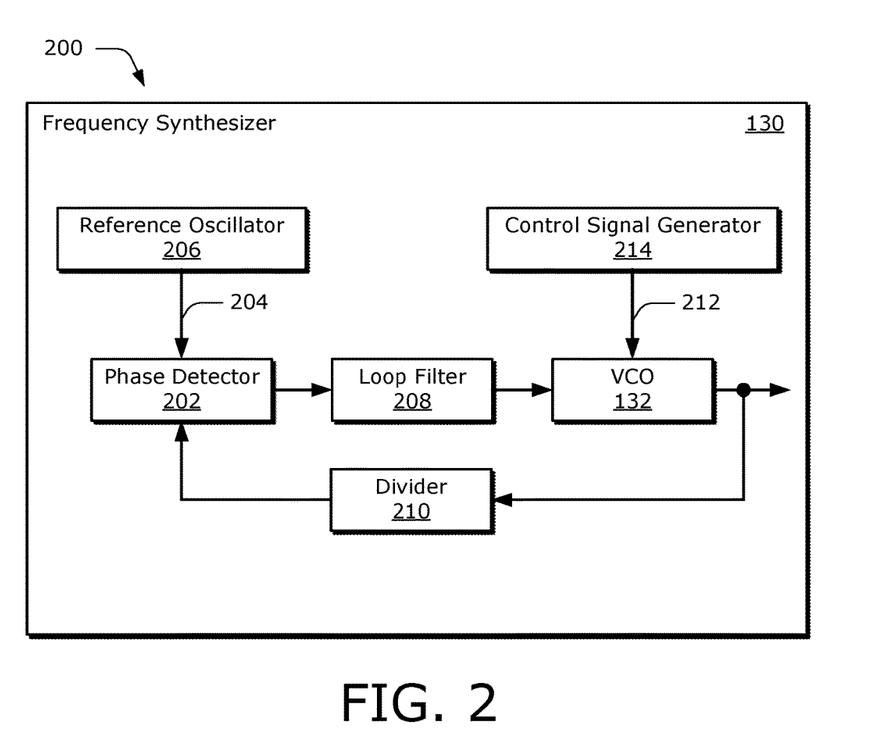
FIG. 2 illustrates an example configuration of the frequency synthesizer shown in FIG. 1.

FIG. 2 illustrates an example configuration of the frequency synthesizer 130. In this particular example, the frequency synthesizer 130 is configured to synthesize an RF signal for use in the transmitter and/or receiver circuits of the wireless transceiver 120, as described with reference to FIG. 1.

In some aspects, the frequency synthesizer 130 is implemented as a phase-locked loop (PLL) frequency synthesizer that includes the VCO 132. As shown, the frequency synthesizer 130 includes a phase detector 202 that receives a reference frequency signal 204 from a reference oscillator 206. An output of the phase detector 202 is connected to an input of a loop filter 208. An output of the loop filter 208 is connected as a control voltage input to the VCO 132. An output of the VCO 132 is connected to an input of a divider 210, and an output of the divider 210 is connected to another input of the phase detector 202.

Alternatively or in addition to the output of the loop filter 208, the VCO can receive at least one control signal 212 from a control signal generator 214. The control signal 212 includes one or more signals related to operational parameters for the frequency synthesizer 130, such as selecting a frequency band for the operation of the VCO 132, coarse and/or fine tuning settings to select the operating frequency of the VCO 132, and so forth. The control signal generator 214 may optionally control other parameters within the frequency synthesizer 130, such as a bandwidth of the loop filter 208, a divide ratio of the divider 210, and so forth.

Figure 3:
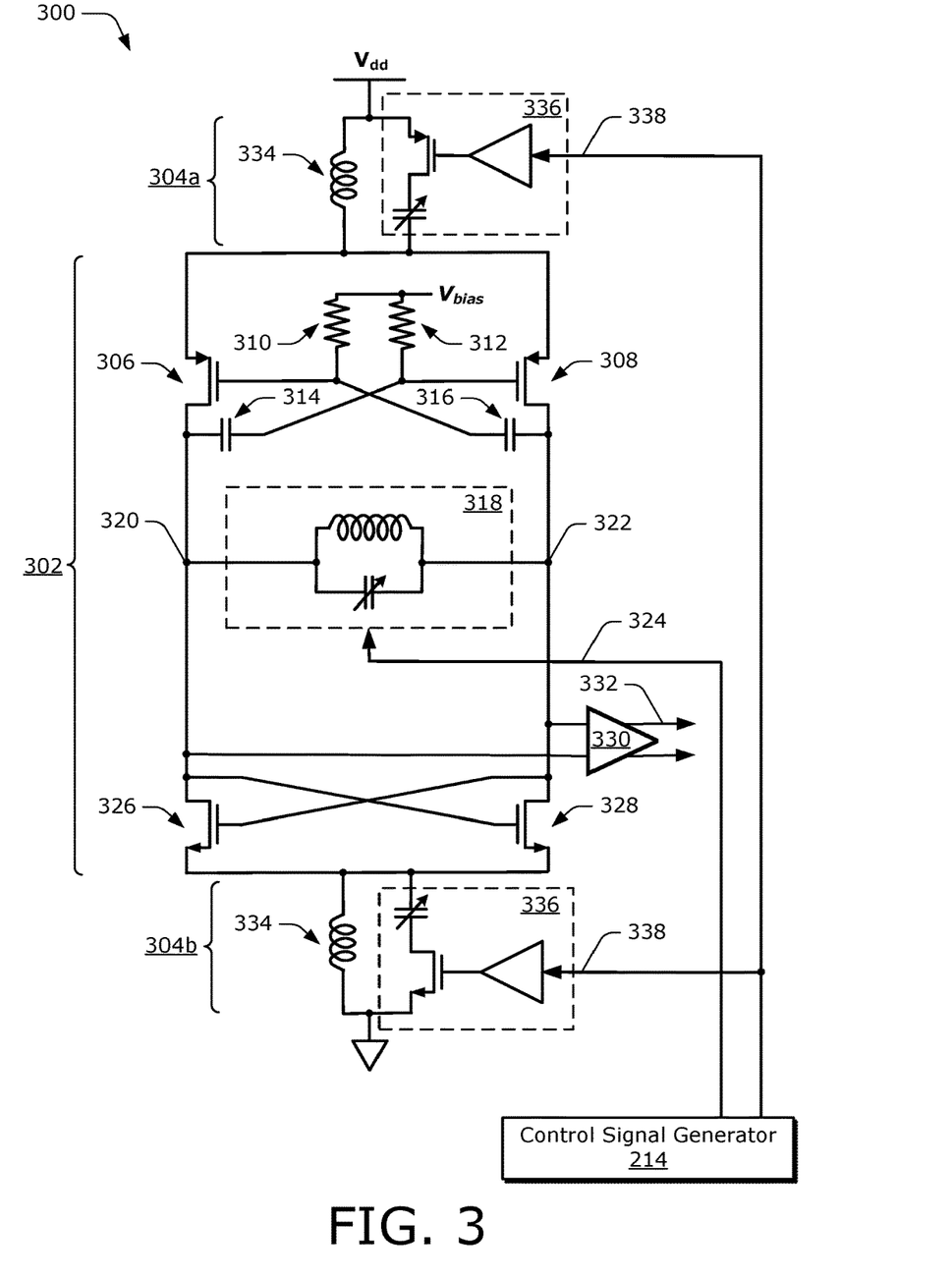
FIG. 3 illustrates an example circuit configuration of a voltage-controlled oscillator (VCO) that incorporates a conventionally-implemented, single-ended degeneration scheme.

FIG. 3 illustrates an oscillator degeneration circuit in VCO circuit 300 that uses conventional singled-ended, tunable degeneration. The VCO circuit 300 is a differential VCO, shown generally at 302, using a pair of cross-coupled P-channel metal oxide semiconductor (PMOS) transistors and a pair of cross-coupled N-channel metal oxide semiconductor (NMOS) transistors connected to a resonant tank circuit. The VCO circuit 300 also includes two singled-ended degeneration circuits 304, shown at 304a and 304b. FIG. 3 also illustrates a control signal generator 214 that produces signals to control different aspects of the operation of the VCO circuit 300, as described in detail below.

In the VCO circuit 300, each PMOS transistor and each NMOS transistor includes a gate, a source, and a drain. As illustrated, the sources of PMOS transistors 306 and 308 are coupled to a supply voltage, $V_{dd}$, by a first tunable degeneration circuit 304a. The gates of the PMOS transistors 306 and 308 are connected through resistors 310 and 312 to a bias voltage, $V_{bias}$. The gate of each PMOS transistor 306 and 308 is capacitively cross-coupled to the drain of the opposite PMOS transistor 308 and 306, respectively, by capacitors 316 and 314. The drains of the PMOS transistors 306 and 308 are connected to a tunable, resonant tank circuit 318, at a pair of nodes (a node 320 and a node 322).

The tank circuit 318 can be implemented using any suitable combination of fixed or variable reactive components (e.g., capacitors and inductors). The control circuit generator 214 provides a tuning signal 324 to vary the resonant frequency of the tank circuit 318. In one example configuration, the tank circuit 318 includes a fixed inductor and a variable capacitor. The tuning signal 324 is varied by the control circuit generator 214 to change the capacitance of the variable capacitor to tune the VCO to the desired frequency.

The tank circuit 318 is in turn connected, at the node 320 and the node 322, to the drains of a cross-coupled pair of NMOS transistors 326 and 328. The gate of the each NMOS transistor 326 and 328 is cross-coupled to the drain of the other NMOS transistor 328 and 326, respectively. Further, the sources of the NMOS transistors 326 and 328 are coupled to ground by a second tunable degeneration circuit 304b. A differential buffer amplifier 330 is connected across the terminals of the tank circuit 318 to provide an output signal 332 from the VCO circuit 300.

Each singled-ended degeneration circuit 304 (shown at 304a and 304b) is a tunable circuit that includes an inductor 334 and a switched capacitor bank 336. The singled-ended degeneration circuits 304a and 304b are both tuned to a frequency that reduces (e.g., attempts to minimize) the phase noise in the output signal 332 of the VCO, at a particular frequency offset from the operating frequency of the VCO circuit 300. For example, the singled-ended degeneration circuits 304a and 304b may be tuned to approximately twice the operating frequency of the VCO circuit 300 to reduce a flicker noise component of the phase noise. The conventional degeneration provided by the singled-ended degeneration circuits 304a and 304b can only be tuned with a high Q over a limited tuning range. As the tuning range of the VCO circuit 300 is increased, the Q of the singled-ended degeneration circuits 304a and 304b is reduced. This results in a decreased amount of phase noise reduction that the singled-ended degeneration circuits 304a and 304b are capable of providing.

The control signal generator 214 provides a control signal 338 to tune the singled-ended degeneration circuits 304a and 304b. The control signal 338 must be routed to two locations to accommodate the two singled-ended degeneration circuits 304a and 304b. This both increases the space occupied on the die by the VCO circuit 300 and increases the complexity of signal routing involved in powering and controlling the VCO circuit 300, as compared to a single, differentially-connected degeneration capacitor bank.

Example Degeneration for a Wideband Voltage-Controlled Oscillator

Figure 4:
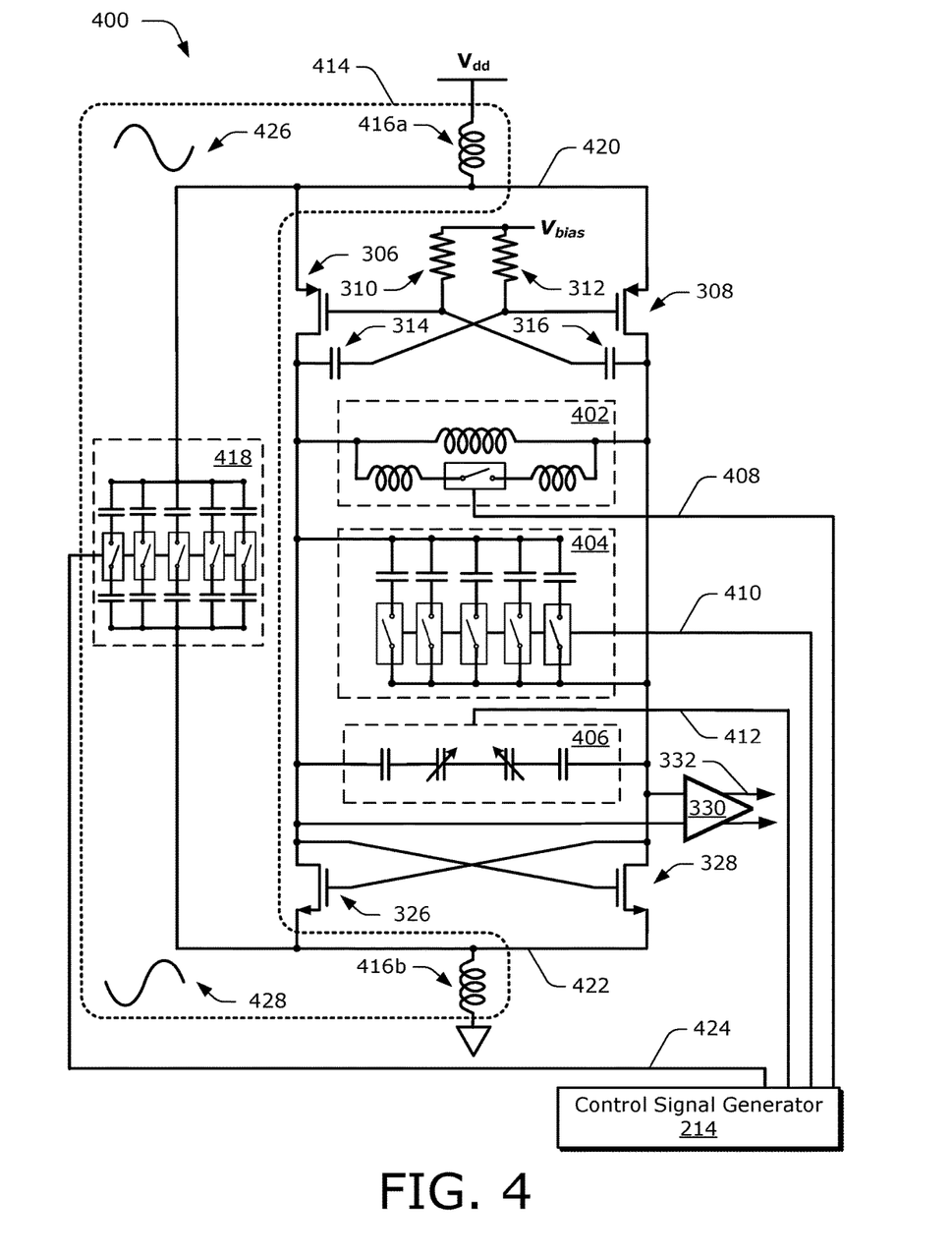
FIG. 4 illustrates an example circuit configuration in accordance with aspects of degeneration for a wideband VCO as described herein.

FIG. 4 illustrates an example wideband VCO circuit 400 in accordance with aspects of degeneration for a wideband voltage-controlled oscillator. The wideband VCO circuit 400 utilizes the same cross-coupled, differential VCO circuit configuration using a pair of cross-coupled PMOS transistors and a pair of cross-coupled NMOS transistors that are connected to a resonant tank circuit at a pair of nodes. FIG. 4 also illustrates a control signal generator 214 that produces signals to control different aspects of the operation of to the wideband VCO circuit 400, as described in detail below.

The tank circuit for the wideband VCO circuit 400 includes a switched inductor network 402, a switched capacitor bank 404 for coarse-tuning the resonant frequency of the tank circuit and a variable capacitor bank 406 (e.g., a varactor capacitor bank) for fine-tuning the resonant frequency of the tank circuit. The control signal generator 214 produces a band-selection control signal 408 that controls a state of the switched inductor network 402 to switch between two inductance values that typically are associated with two different frequency bands in which the wideband VCO 400 circuit operates. A novel example implementation for the switched inductor network 402 is described in U.S. patent application Ser. No. 15/705,855 entitled "Switchable Inductor Network for Wideband Circuits" filed Sep. 15, 2017. However, the switched inductor network 402 can be implemented in alternative manners.

The switched capacitor bank 404 includes one or more capacitors and switches that are controlled to select a capacitance from multiple capacitance values. The selected capacitance value, in conjunction with the switched inductor network 402, determines the frequency band, or a portion of the frequency band, in which the wideband VCO circuit 400 will operate. The control signal generator 214 produces a coarse-tuning control signal 410 that controls a state of the switched capacitor bank 404 to switch between the multiple capacitance values provided by the switched capacitor bank 404. The variable capacitor bank 406 includes one or more capacitors and/or variable capacitors (e.g., varactors) that are used to fine tune the wideband VCO circuit 400 to a particular operating frequency in the selected frequency band. The control signal generator 214 produces a fine-tuning control signal 412 that is coupled to the variable capacitor bank 406 to fine tune the wideband VCO circuit 400.

Wideband degeneration for the wideband VCO circuit 400 is provided by a degeneration network 414 that includes inductors 416 (shown at 416a and 416b) and a degeneration capacitor bank 418. The inductor 416a of the degeneration network 414 connects the sources of the PMOS transistors 306 and 308, at a node 420, to the supply voltage, $V_{dd}$. The degeneration capacitor bank 418 of the degeneration network 414 is connected, across the differential VCO, between the sources of the PMOS transistors 306 and 308, at the node 420, and the sources of the NMOS transistors 326 and 328, at a node 422. The inductor 416b of the degeneration network 414 is connected between the sources of the NMOS transistors 326 and 328, at the node 422, and ground. The inductors 416a and 416b can be have the same inductance value or different inductance values.

The control signal generator 214 provides a degeneration-tuning control signal 424 to the degeneration capacitor bank 418 to tune a frequency of the degeneration network 414. By way of example and not limitation, the degeneration capacitor bank 418 can be implemented using a 5-bit switched capacitor bank providing $2^5$ capacitance values for tuning the frequency of the degeneration network 414. It should be noted that for clarity of illustration, the band-selection control signal 408, the coarse-tuning control signal 410, the fine-tuning control signal 412, and the degeneration-tuning control signal 424 are shown as separate lines in FIG. 4; however, these control signals may be implemented using any suitable technique or combination of techniques, such as a digital logic control signal, an analog control signal, a parallel digital bus, and so forth.

Control bits (not explicitly shown) for the degeneration capacitor bank 418 are set to reduce (e.g., in an attempt to minimize) the phase noise generated by the wideband VCO circuit 400 by providing differential degeneration to the wideband VCO circuit 400, as illustrated by the complementary degeneration signals at 426 and 428. For example, the degeneration capacitor bank 418 may be set to tune the degeneration network 414 to reduce phase noise generated at approximately twice the operating frequency of the wideband VCO circuit 400 to reduce the flicker (e.g., the 1/f) noise component in the phase noise of the output signal 332 of the wideband VCO circuit 400 (e.g., the degeneration signals at 426 and 428 are twice the frequency of the output signal 332 of the VCO circuit 400). The control signal generator 214 may determine the value of the control bits in any suitable fashion, such as calculating the value of the control bits algorithmically from the tuning frequency of the VCO, selecting the appropriate value of the control bits from a lookup table stored in the CRM 110, and so forth.

The degeneration network 414 can provide twice the Q of the single-ended degeneration circuits 304a and 304b (of FIG. 3) for a given switch size in the degeneration capacitor bank 418. Additionally, the layout of the degeneration network 414 is simpler and more compact than conventional single-ended degeneration because the number of supply voltage, ground, and control routings can be reduced for the wideband VCO circuit 400 as compared to those for the VCO circuit 300 of FIG. 3.

Techniques of Degeneration for a Wideband Voltage-Controlled Oscillator

The following techniques of degeneration for a wideband voltage-controlled oscillator may be implemented using the previously-described elements of the example environment, components, or circuits. Reference to elements, such as the switched inductor network 402, the switched capacitor bank 404, the variable capacitor bank 406, the degeneration network 414, the inductors 416a and 416b, the degeneration capacitor bank 418, and the degeneration-tuning control signal 424, is made by example only and is not intended to limit the ways in which the techniques can be implemented.

The techniques are described with reference to an example method illustrated in FIG. 5, which is depicted as respective sets of operations or acts that may be performed by entities described herein. The operations described herein may be performed using any suitable circuitry or component, which may provide means for implementing one or more of the operations. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 5:
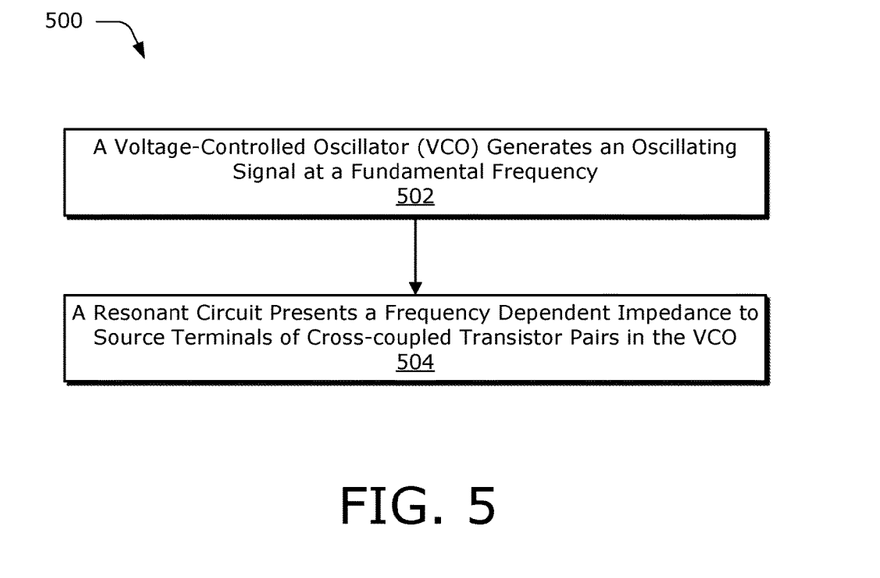
FIG. 5 illustrates an example method for aspects of degeneration for a wideband VCO.

FIG. 5 illustrates an example method 500 for degeneration for a wideband voltage-controlled oscillator that generally relates to operating a voltage-controlled oscillator (VCO), including operations performed by the degeneration network 414 that include the inductors 416a and 416b and the degeneration capacitor bank 418.

At 502, a voltage-controlled oscillator generates an oscillating signal at a fundamental frequency. For example, a VCO (e.g., the wideband VCO 400) generates an oscillating signal at a fundamental frequency, the VCO comprising a tunable, resonant tank circuit (e.g., the switched inductor network 402, the switched capacitor bank 404, and the variable capacitor bank 406), cross-coupled PMOS transistors (e.g., the PMOS transistors 306 and 308), the drain terminals of the cross-coupled PMOS transistors (e.g., the PMOS transistors 306 and 308) being connected to the tunable, resonant tank circuit (e.g., the switched inductor network 402, the switched capacitor bank 404, and the variable capacitor bank 406), and the source terminals of cross-coupled PMOS transistors (e.g., the PMOS transistors 306 and 308) being connected to a first node (e.g., the node 420), and cross-coupled NMOS transistors (e.g., the NMOS transistors 326 and 328) the drain terminals of cross-coupled NMOS transistors (e.g., the NMOS transistors 326 and 328) being connected to the tunable, resonant tank circuit (e.g., the switched inductor network 402, the switched capacitor bank 404, and the variable capacitor bank 406), and the source terminals of cross-coupled NMOS transistors (e.g., the NMOS transistors 326 and 328) being connected to a second node (e.g., the node 422).

At 504, a resonant circuit presents a frequency-dependent impedance to sources of cross-coupled transistor pairs of the VCO. For example, a resonant circuit (e.g., the degeneration network 414) presents a frequency-dependent impedance to the source terminals of the cross-coupled transistor pairs (e.g., the PMOS transistors 306 and 308, and the NMOS transistors 326 and 328), the resonant circuit (e.g., the degeneration network 414) comprising a first inductor (e.g., the inductor 416a) that is connected between the first node (e.g., the node 420) and a supply voltage (e.g., $V_{dd}$), a second inductor (e.g., the inductor 416b) that is connected between the second node (e.g., the node 422) and a ground, and a capacitor (e.g., the degeneration capacitor bank 418) that is connected between the first node (e.g., the node 420) and the second node (e.g., the node 422), the capacitor (e.g., the degeneration capacitor bank 418) tuning the resonant circuit (e.g., the degeneration network 414) to resonate at a frequency that is twice the fundamental frequency.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A voltage-controlled oscillator (VCO) circuit comprising:
   a tank circuit coupled to a pair of nodes, the pair of nodes including a first node and a second node;
   a first cross-coupled transistor pair of a first transistor type, a drain terminal of a first transistor of the first cross-coupled transistor pair connected to the first node of the pair of nodes, a drain terminal of a second transistor of the first cross-coupled transistor pair connected to the second node of the pair of nodes, and a source terminal of the first transistor of the first cross-coupled transistor pair and a source terminal of the second transistor of the first cross-coupled transistor pair connected to a third node;
   a second cross-coupled transistor pair of a second transistor type, a drain terminal of a third transistor of the second cross-coupled transistor pair connected to the first node of the pair of nodes, a drain terminal of a fourth transistor of the second cross-coupled transistor pair connected to the second node of the pair of nodes, and a source terminal of the third transistor of the second cross-coupled transistor pair and a source terminal of the fourth transistor of the second cross-coupled transistor pair connected to a fourth node; and
   a degeneration network comprising:
   a first inductor connected between the third node and a supply voltage;
   a second inductor connected between the fourth node and a ground; and a capacitor, a first terminal of the capacitor connected to the third node and a second terminal of the capacitor connected to the fourth node, the capacitor comprising a switched degeneration capacitor bank configured to provide a degeneration capacitance value selected from multiple capacitance values based on a degeneration-tuning control signal.

2. The VCO circuit of claim 1, wherein
the first terminal of the capacitor is connected to the third node between:
the first inductor; and
the source terminal of the first transistor and the source terminal of the second transistor of the first cross-coupled transistor pair; and
the second terminal of the capacitor is connected to the fourth node between:
the source terminal of the third transistor and the source terminal of the fourth transistor of the second cross-coupled transistor pair; and
the second inductor.

3. The VCO circuit of claim 1, wherein the selected degeneration capacitance value tunes the degeneration network to degenerate the VCO circuit.

4. The VCO circuit of claim 3, wherein the degeneration network is tunable to a frequency that is approximately twice a resonant frequency of the tank circuit.

5. The VCO circuit of claim 3, wherein the degeneration network is tunable to reduce a level of phase noise in an output signal of the VCO circuit.

6. The VCO circuit of claim 1, wherein the first inductor and the second inductor have a same inductance value.

7. The VCO circuit of claim 1, wherein the first inductor and the second inductor have different inductance values.

8. The VCO circuit of claim 1, wherein the tank circuit comprises:
a third inductor connected to the pair of nodes;
a switched capacitor bank connected to the pair of nodes; and
a variable capacitor bank connected to the pair of nodes.

9. The VCO circuit of claim 8, wherein:
the third inductor comprises a switched inductor network, and the switched inductor network is configured to provide an inductance value from multiple inductance values, based on a band-selection control signal;
the switched capacitor bank is configured to provide a coarse-tuning capacitance value from multiple capacitance values provided by the switched capacitor bank, based on a coarse-tuning control signal; and
the variable capacitor bank is configured to set a fine-tuning capacitance value from a range of capacitance values provided by the variable capacitor bank, based on a fine-tuning control signal.

10. The VCO circuit of claim 9, wherein the band-selection control signal, the coarse-tuning control signal, and the fine-tuning control signal determine a resonant frequency of the tank circuit.

11. The VCO circuit of claim 9, wherein:
the switched capacitor bank is configured to couple or uncouple capacitors based on multiple bits in a control value of the coarse-tuning control signal; and
the switched inductor network is configured to switch between a first inductance value and a second inductance value.

12. The VCO circuit of claim 1, wherein:
the first transistor and the second transistor of the first transistor type comprise P-channel metal oxide semiconductor (PMOS) transistors; and
the third transistor and the fourth transistor of the second transistor type comprise N-channel metal oxide semiconductor (NMOS) transistors.

13. A voltage-controlled oscillator (VCO) comprising:
a tank circuit coupled to a pair of nodes, the pair of nodes including a first node and a second node;
a first cross-coupled transistor pair of a first transistor type, a drain terminal of a first transistor of the first cross-coupled transistor pair connected to the first node of the pair of nodes, a drain terminal of a second transistor of the first cross-coupled transistor pair connected to the second node of the pair of nodes, and a source terminal of the first transistor of the first cross-coupled transistor pair and a source terminal of the second transistor of the first cross-coupled transistor pair connected to a third node;
a second cross-coupled transistor pair of a second transistor type, a drain terminal of a third transistor of the second cross-coupled transistor pair connected to the first node of the pair of nodes, a drain terminal of a fourth transistor of the second cross-coupled transistor pair connected to the second node of the pair of nodes, and a source terminal of the third transistor of the second cross-coupled transistor pair and a source terminal of the fourth transistor of the second cross-coupled transistor pair connected to a fourth node; and
means for providing differential degeneration to the VCO, comprising:
a first inductor connected between the third node and a supply voltage;
a second inductor connected between the fourth node and a ground; and
means for providing a degeneration capacitance having a degeneration capacitance value selected from multiple capacitance values, the means for providing the degeneration capacitance connected to the third node and the fourth node.

14. The VCO of claim 13, wherein: the means for providing the degeneration capacitance is connected to the third node between:
the first inductor; and
the source terminal of the first transistor and the source terminal of the second transistor of the first cross-coupled transistor pair; and
the means for providing the degeneration capacitance is connected to the fourth node between: the source terminal of the third transistor and the source terminal of the fourth transistor of the second cross-coupled transistor pair; and the second inductor.

15. The VCO of claim 13, wherein:
the capacitor means for providing the degeneration capacitance comprises a switched degeneration capacitor bank; and
the switched degeneration capacitor bank is configured to be controlled by a degeneration-tuning control signal to provide the selected degeneration capacitance value from the multiple capacitance values provided by the switched degeneration capacitor bank.

16. The VCO of claim 15, wherein the selected degeneration capacitance value tunes the means for providing differential degeneration to the VCO.

17. The VCO of claim 15, wherein the selected degeneration capacitance value tunes the means for providing differential degeneration to the VCO to reduce a level of phase noise generated by the VCO.

18. The VCO of claim 15, wherein the means for providing differential degeneration to the VCO is tunable to a frequency that is approximately twice a tuning frequency of the VCO.

19. The VCO of claim 13, wherein the tank circuit comprises:
a switched inductor network connected to the pair of nodes;
a switched capacitor bank connected to the pair of nodes; and
a variable capacitor bank connected to the pair of nodes.

20. The VCO of claim 19, wherein:
the switched inductor network is configured to provide an inductance value from multiple inductance values, based on a band-selection control signal;
the switched capacitor bank is configured to provide a coarse-tuning capacitance value from multiple capacitance values provided by the switched capacitor bank, based on a coarse-tuning control signal; and
the variable capacitor bank is configured to set a fine-tuning capacitance value from a range of capacitance values provided by the variable capacitor bank, based on a fine-tuning control signal.

21. A voltage-controlled oscillator (VCO) operating method comprising:
generating an oscillating signal having a fundamental frequency using a VCO, the VCO comprising:
a tank circuit;
a first cross-coupled transistor pair of a first transistor type, drain terminals of the first cross-coupled transistor pair being connected to the tank circuit, and source terminals of the first cross-coupled transistor pair connected to a first node; and
a second cross-coupled transistor pair of a second transistor type, drain terminals of the second cross-coupled transistor pair of the second transistor type being connected to the tank circuit, and source terminals of the second cross-coupled transistor pair connected to a second node;
presenting a frequency-dependent impedance to the source terminals of the first and second cross-coupled transistor pairs using a resonant circuit, the resonant circuit comprising:
a first inductor connected between the first node and a supply voltage;
a second inductor connected between the second node and a ground; and
a capacitor connected between the first node and the second node, the capacitor comprising a switched degeneration capacitor hank configured to provide a degeneration capacitance value selected from multiple capacitance values based on a degeneration-tuning control signal,
wherein the resonant circuit is tuned to resonate at a frequency that is approximately twice the fundamental frequency.

22. The method of claim 21, the method further comprising:
tuning the resonant circuit to the frequency by selecting the degeneration capacitance value from the multiple capacitance values.

23. The method of claim 22, wherein the tuning of the resonant circuit comprises reducing a level of phase noise in an output signal of the VCO.

24. The method of claim 21, wherein the tank circuit comprises:
an inductor; and
a variable capacitor bank.

25. The method of claim 24, wherein the inductor comprises a switched inductor network.

26. A frequency synthesizer apparatus, comprising:
a phase locked loop (PLL) synthesizer comprising:
a reference oscillator configured to generate a reference frequency signal; and
a voltage-controlled oscillator (VCO) configured to generate an output signal having a frequency that is controlled at least partially by the reference frequency signal, the VCO including a degeneration network that is configured to degenerate phase noise in the output signal of the VCO in response to a degeneration-tuning control signal, the degeneration network comprising a degeneration capacitor bank that is configured to tune the degeneration network in relation to the frequency of the VCO; and
a control signal generator configured to provide:
a band-selection control signal to select an inductance value from multiple inductance values provided by a switched inductor network included in the VCO, the selected inductance value determining a frequency band of operation for the frequency synthesizer;
a coarse-tuning control signal and a fine-tuning control signal to set the frequency of the output signal of the VCO; and
the degeneration-tuning control signal to tune the degeneration network to provide at least one differential degeneration signal to reduce the phase noise in the output signal of the VCO.

27. The frequency synthesizer apparatus of claim 26, wherein the VCO includes:
a tank circuit comprising:
the switched inductor network coupled to the control signal generator and configured to receive the band-selection control signal;
a switched capacitor bank coupled to the control signal generator and configured to receive the coarse-tuning control signal; and
a variable capacitor bank coupled to the control signal generator and configured to receive the fine-tuning control signal.

28. The frequency synthesizer apparatus of claim 26, wherein the degeneration capacitor bank is connected in parallel with the VCO.

29. The frequency synthesizer apparatus of claim 28, wherein:
the VCO comprises:
a first cross-coupled transistor pair, source terminals of the first cross-coupled transistor pair connected to a first node; and
a second cross-coupled transistor pair, source terminals of the second cross-coupled transistor pair connected to a second node; and
the degeneration capacitor bank is connected in parallel with the VCO by being connected to the first node and the second node.

30. The frequency synthesizer apparatus of claim 29, wherein the degeneration network comprises:
a first inductor connected between the first node and a supply voltage; and
a second inductor connected between the second node and a ground.

* * * * *